(12) United States Patent
Chang et al.

(10) Patent No.: US 8,637,161 B2
(45) Date of Patent: Jan. 28, 2014

(54) COATED ARTICLE AND METHOD FOR MANUFACTURING THE COATED ARTICLE

(75) Inventors: Hsin-Pei Chang, New Taipei (TW);
Wen-Rong Chen, New Taipei (TW);
Huann-Wu Chiang, New Taipei (TW);
Cheng-Shi Chen, New Taipei (TW);
Cong Li, Shenzhen (CN)

(73) Assignees: Hong Fu Jin Precision Industry (ShenZhen) Co., Ltd, Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 155 days.

(21) Appl. No.: 13/207,109

(22) Filed: Aug. 10, 2011

(65) Prior Publication Data
US 2012/0171508 A1 Jul. 5, 2012

(30) Foreign Application Priority Data

Aug. 10, 2011 (CN) .......................... 2010 1 0616922

(51) Int. Cl.
| | | |
|---|---|---|
| B22F 3/00 | (2006.01) | |
| B32B 15/04 | (2006.01) | |
| B32B 15/00 | (2006.01) | |
| B32B 15/01 | (2006.01) | |
| B32B 9/00 | (2006.01) | |
| C01B 35/04 | (2006.01) | |
| F01D 5/14 | (2006.01) | |

(52) U.S. Cl.
USPC ........... 428/545; 428/627; 428/666; 428/670; 428/698; 423/297; 416/241 R

(58) Field of Classification Search
None
See application file for complete search history.

(56) References Cited

U.S. PATENT DOCUMENTS 4,761,346 A * 8/1988 Naik .............................. 428/627
5,294,489 A * 3/1994 Luthra et al. .................. 428/379

* cited by examiner

*Primary Examiner* — Gwendolyn Blackwell
*Assistant Examiner* — Seth Dumbris
(74) *Attorney, Agent, or Firm* — Altis Law Group, Inc.

(57) ABSTRACT

A coated article is provided. A coated article includes a composite substrate made from carbon fiber and zirconium diboride. A chromium layer is deposited on the substrate. A chromium diffusing layer is formed between the substrate and the chromium layer. A chromium-nitrogen layer is deposited on the chromium layer. A iridium layer is deposited on the chromium-nitrogen layer opposite to the chromium layer, wherein the chromium-nitrogen layer includes a first chromium-nitrogen layer and a second chromium-nitrogen layer. The first chromium-nitrogen layer abuts the chromium layer. The second chromium-nitrogen layer abuts the iridium layer. The atomic nitrogen content in the first chromium-nitrogen layer gradually increases with the thickness of the first chromium-nitrogen layer. The atomic nitrogen content in the second chromium-nitrogen layer gradually decreases with the thickness of the second chromium-nitrogen layer.

15 Claims, 2 Drawing Sheets

COATED ARTICLE AND METHOD FOR MANUFACTURING THE COATED ARTICLE

BACKGROUND

1. Technical Field

The exemplary disclosure generally relates to coated articles and a method for manufacturing the coated articles.

2. Description of Related Art

Carbon fiber has a low thermo expansion coefficient, low density and good corrosion resistance so it is widely used in many fields, such as the aerospace and automotive industries. However, composites made from carbon fiber and zirconium diboride ($ZrB_2$) have a low temperature oxidation resistance. Niobium alloy has a good oxidation resistance in high temperature. However, niobium alloy has a low wetability to polymer.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary coated article and method for manufacturing the coated article. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
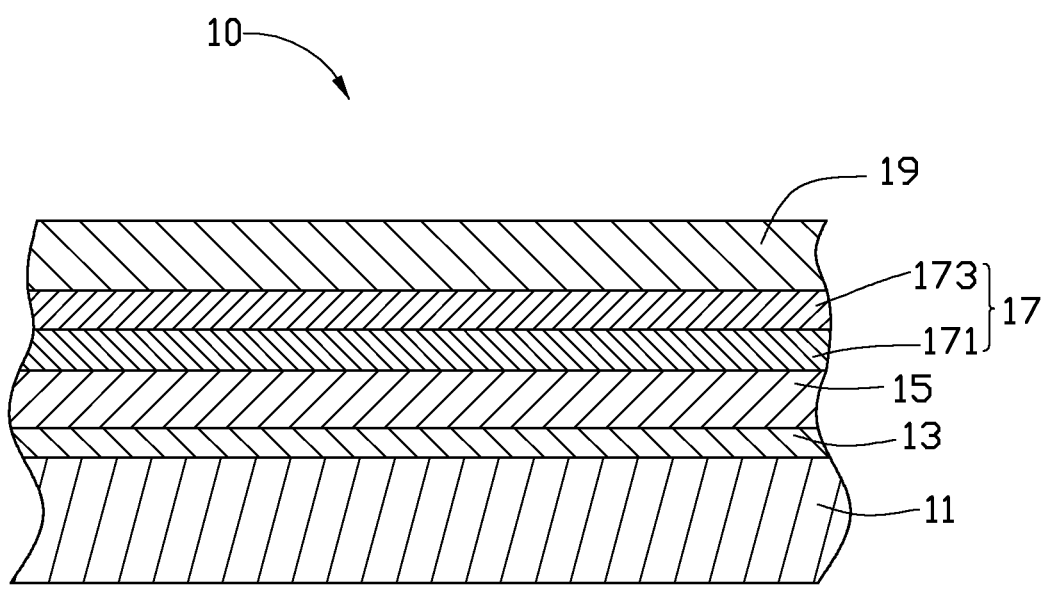
FIG. 1 is a cross-sectional view of an exemplary embodiment of a coated article.

FIG. 1 shows an exemplary embodiment of a coated article 10 including a substrate 11, a chromium layer 15 deposited on the substrate 11, a chromium diffusing layer 13 formed between the substrate 11 and the chromium layer 15, a chromium-nitrogen (Cr—N) layer 17 deposited on the chromium layer 15, and an iridium layer 19 deposited on the chromium-nitrogen layer 17 opposite to the chromium layer 15.

The substrate 11 may be made of carbon fiber and zirconium diboride ($ZrB_2$) composites (Cf/$ZrB_2$ composite).

The chromium layer 15, chromium-nitrogen layer 17 and iridium layer 19 can be deposited by magnetron sputtering.

The chromium layer 15 has a thickness of about 0.2 micrometers (μm) to about 0.3 μm.

The chromium-nitrogen layer 17 comprises nitrogen solid solution, chromium metal phase and chromium-nitrogen phase. The chromium-nitrogen layer 17 includes a first chromium-nitrogen layer 171 and a second chromium-nitrogen layer 173. The first chromium-nitrogen layer 171 abuts the chromium layer 15, and the second chromium-nitrogen layer 173 abuts the iridium layer 19. The atomic nitrogen content in the first chromium-nitrogen layer 171 gradually increases with the thickness of the first chromium-nitrogen layer 171. The atomic nitrogen content in the second chromium-nitrogen layer 173 gradually decreases with the thickness of the first chromium-nitrogen layer 173. The first chromium-nitrogen layer 171 has a thickness of about 0.4 μm to about 0.6 μm. The second chromium-nitrogen layer 173 has a thickness of about 0.4 μm to about 0.6 μm. The chromium-nitrogen layer 17 has a total thickness of about 0.8 μm to about 1.2 μm.

The iridium layer 19 has a thickness of about 0.8 μm to about 1 μm.

The chromium diffusing layer 13 is formed between the chromium layer 15 and the substrate 11 in such a way that chromium atoms in the chromium layer 15 can diffuse toward the substrate 11 during deposition of the chromium layer 15 on the substrate 11. The chromium diffusing layer 13 comprises carbon-fiber, Zirconium-diboride ceramic phase, chromium metal phase and chromium-carbon phase.

Figure 2:
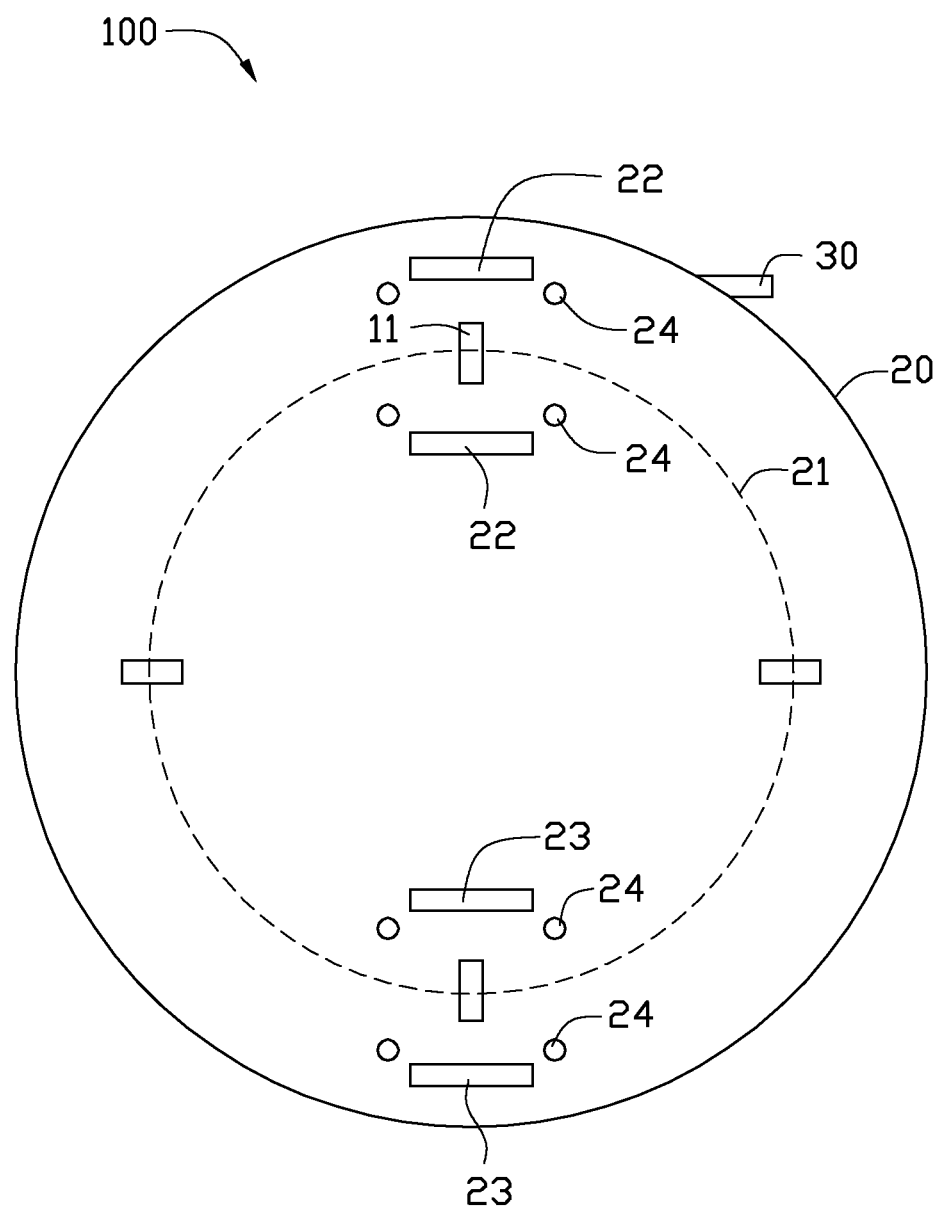
FIG. 2 is a schematic view of a magnetron sputtering coating machine for manufacturing the coated article in FIG. 1.

Referring to FIG. 2, a method for manufacturing the coated article 10 may include at least the following steps:

Providing a substrate 11. The substrate 11 may be made of carbon fiber and Zirconium diboride ($ZrB_2$) composites.

Providing a vacuum sputtering coating machine 100. The vacuum sputtering coating machine 100 includes a sputtering coating chamber 20 and a vacuum pump 30 connecting to the sputtering coating chamber 20. The vacuum pump 30 is used evacuate the sputtering coating chamber 20. The vacuum sputtering coating machine 100 further includes a rotating bracket 21, two first targets 22, two second targets 23 and a plurality of gas inlets 24. The rotating bracket 21 rotates the substrate 11 in the sputtering coating chamber 20 relative to the first targets 22 and the second targets 23. The first targets 22 face each other, and are respectively located on one side of the rotating bracket 21. The second targets 23 face each other, and are respectively located on opposite sides of the rotating bracket 21. In this exemplary embodiment, the first targets 22 are chromium targets, the second targets 23 are iridium targets.

Cleaning the substrate 11 by plasma cleaning process. The substrate 11 is then positioned in the vacuum sputtering coating machine 100. The vacuum level inside the sputtering coating chamber 20 is evacuated to about $8.0 \times 10^{-3}$ Pa. Argon (Ar) may be used as a working gas and is injected into the sputtering coating chamber 20 at a flow rate of about 300 Standard Cubic Centimeters per Minute (sccm) to about 500 sccm. The substrate 11 may have a negative bias voltage from about −500 V to about −800 V, so high-frequency voltage is produced in the sputtering coating chamber 20 and the Ar is ionized to plasma. The plasma then strikes the surface of the substrate 11 to clean the surface of the substrate 11. Plasma cleaning the substrate 11 may take from about 5 min to about 15 min. The plasma cleaning process enhances the bonding force between the substrate 11 and the chromium layer 15. The first targets 22 and the second targets 23 are unaffected by the plasma cleaning process.

Depositing a chromium layer 15 on the pretreated substrate 11. The inside of the sputtering coating chamber is heated to about 100° C. (degrees Celsius) to about 200° C. Argon (Ar) may be used as a working gas and is fed into sputtering coating chamber 20 at a flow rate of about 20 sccm to about 150 sccm. Power is applied to the first targets 22 fixed in the sputtering coating chamber 20 are evaporated at a power between about 2 kW to about 5 kW, and the substrate 11 may have a negative bias voltage of about −100 V to about −300 V to deposit the chromium layer 15 on the substrate 11. Deposition of the chromium layer 15 may take from about 150 min to about 250 min During the deposition of the chromium layer 15, atomic chromium in the chromium layer 15 can diffuse toward the substrate 11 to form a chromium diffusing layer 13 comprises carbon-fiber, Zirconium-diboride ceramic phase, chromium metal phase and chromium-carbon phase. The chromium diffusing layer 13 enhances the bonding force between the substrate 11 and the chromium layer 15.

Deposition of the chromium-nitrogen layer 17 on the chromium layer 15 as follows. Deposition of the first chromium-nitrogen layer 171 on the chromium layer 15. The internal temperature of the sputtering coating chamber 20 is maintained at about 100° C. to about 200° C. Argon (Ar) may be used as a working gas and is injected into the sputtering coating chamber 20 at a flow rate from about 20 sccm to about 150 sccm. Nitrogen ($N_2$) may be used as reaction gas. The nitrogen may have a flow rate of about 10 sccm to about 100 sccm. The first targets 22 in the sputtering coating chamber 20 are evaporated at a power between about 2 kW to about 5 kW. The substrate 11 may have a negative bias voltage about −100 V to about −300 V to deposit the first chromium-nitrogen layer 171 on the chromium layer 15. Deposition of the first chromium-nitrogen layer 171 may take from about 15 min to about 35 min. During the deposition of the first chromium-nitrogen layer 171 on the chromium layer 15, the flow rate of the nitrogen is increased about 15 sccm to 20 sccm every 5 min. Thus, the atomic nitrogen content in the first chromium-nitrogen layer 171 gradually increases with the thickness of the first chromium-nitrogen layer 171.

Deposition the second chromium-nitrogen layer 173 on the first chromium-nitrogen layer 171. The internal temperature of the sputtering coating chamber 20 is maintained at about 100° C. to about 200° C. Argon (Ar) may be used as a working gas and is injected into the sputtering coating chamber 20 at a flow rate of about 20 sccm to about 150 sccm. Nitrogen ($N_2$) may be used as a reaction gas. The nitrogen may have a flow rate from about 50 sccm to about 130 sccm. The first targets 22 in the sputtering coating chamber 20 are evaporated at a power between about 2 kW to about 5 kW. The substrate 11 may have a negative bias voltage from about −100 V to about −300 V to deposit the second chromium-nitrogen layer 173 on the first chromium-nitrogen layer 171. Deposition of the first chromium-nitrogen layer 171 may take from about 15 min to about 25 min During deposition the second chromium-nitrogen layer 173 on first chromium-nitrogen layer 171, the flow rate of the nitrogen is decreased about 10 sccm to 20 sccm every 5 min. Thus, the atomic nitrogen content in the second chromium-nitrogen layer 173 gradually decreases with the thickness of the second chromium-nitrogen layer 173.

An iridium layer 19 is deposited on the second chromium-nitrogen layer 173. The internal temperature of the sputtering coating chamber 20 is maintained at about 100° C. to about 200° C. Argon (Ar) may be used as a working gas and is fed into the sputtering coating chamber 20 at a flow rate of about 20 sccm to about 150 sccm. The second targets 23 in the sputtering coating chamber 20 are evaporated at a power between about 2 kW to about 5 kW. The substrate 11 may have a negative bias voltage about −100 V to about −300 V to deposit the iridium layer 19 on the second chromium-nitrogen layer 173. Deposition of the iridium layer 19 may take from about 60 min to about 85 min.

The iridium layer 19 has a density, which can prevent environmental oxygen from diffusing into the iridium layer 19. Thus, the iridium layer 19 can cause the coated article 10 to have high temperature oxidation resistance. Additionally, during deposition of the iridium layer 19, iridium atoms in the iridium layer 19 can diffuse toward the chromium layer 15, creating a smooth transition between the iridium layer 19 and the chromium layer 15, enhancing the bonding force between the iridium layer 19 and the second chromium-nitrogen layer 173. Chromium atoms in the chromium layer 15 can diffuse toward the substrate 11 to form a chromium diffusing layer 13 enhancing the bonding force between the substrate 11 and the chromium layer 15. Furthermore, the thermal expansion rate of the chromium-nitrogen layer 17 gradually changes from a value close to that of the chromium layer 15 to a value close to that of iridium layer 19. This result in a composite coated article 10 well suited to temperature changes due to the gradual, rather than abrupt, changes in its internal thermal expansion rates. Thus, the substrate 11, the chromium layer 15, chromium-nitrogen layer 17 and the iridium layer 19 can be well bound together, and the iridium layer 19 cannot be easily peeled off the substrate 11. Thus, the coated article 10 has a good shock resistance.

When the coated article 10 is located in high temperature and oxygen environment, the chromium-nitrogen layer 17 can react with oxygen to form chromium-oxygen-nitrogen (Cr—O—N) layer, which has a density preventing exterior oxygen from diffusing in the chromium layer 15. Thus, it might avoid the coated article 10 from getting a sharp decline of the temperature oxidation resistance caused by the accidental invalidation of the iridium layer 19.

It is to be understood, however, that even through numerous characteristics and advantages of the exemplary disclosure have been set forth in the foregoing description, together with details of the system and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A coated article, comprising:
    a composite substrate made from carbon fiber and zirconium diboride;
    a chromium layer deposited on the substrate;
    a chromium diffusing layer formed on the substrate and adjacent to the chromium layer, the chromium diffusing layer comprising carbon-fiber, zirconium-diboride ceramic phase, chromium metal phase and chromium-carbon phase;
    a chromium-nitrogen layer deposited on the chromium layer; and
    an iridium layer deposited on the chromium-nitrogen layer opposite to the chromium layer;
    wherein the chromium-nitrogen layer comprises a first chromium-nitrogen layer and a second chromium-nitrogen layer, the first chromium-nitrogen layer abuts the chromium layer, the second chromium-nitrogen layer abuts the iridium layer, the atomic nitrogen content in the first chromium-nitrogen layer increases from a surface of the first chromium-nitrogen layer near the chromium diffusing layer to a opposite surface of the first chromium-nitrogen layer near the second chromium-nitrogen layer, the atomic nitrogen content in the second chromium-nitrogen layer decreases from a surface of the second chromium-nitrogen layer near the first chromium-nitrogen layer to a opposite surface of the second chromium-nitrogen layer near the iridium layer.

2. The coated article as claimed in claim 1, wherein the chromium layer has a thickness of about 0.2 μm to about 0.3 μm.

3. The coated article as claimed in claim 1, wherein the iridium layer has a thickness of about 0.8 μm to about 1 μm.

4. The coated article as claimed in claim 1, wherein the chromium layer, chromium-nitrogen layer and iridium layer are deposited by magnetron sputtering.

5. The coated article as claimed in claim 1, wherein during deposition of the chromium layer on the substrate, the chromium atoms in the chromium layer diffuse toward the substrate to form the chromium diffusing layer between the chromium layer and the substrate.

6. The coated article as claimed in claim 1, wherein the first chromium-nitrogen layer has a thickness of about 0.4 μm to about 0.6 µm, the second chromium-nitrogen layer has a thickness of about 0.4 µm to about 0.6 µm.

7. The coated article as claimed in claim 1, wherein the chromium-nitrogen layer has a total thickness of about 0.8 µm to about 1.2 µm.

8. The coated article as claimed in claim 1, wherein the chromium-nitrogen layer comprises nitrogen solid solution, chromium metal phase, chromium-nitrogen phase, and iridium atoms.

9. A coated article, comprising:
   a composite substrate made from carbon fiber and zirconium diboride;
   a chromium layer deposited on the substrate;
   a chromium diffusing layer formed between the substrate and the chromium layer, the chromium diffusing layer comprising carbon-fiber, zirconium-diboride ceramic phase, chromium metal phase and chromium-carbon phase;
   a chromium-nitrogen layer deposited on the chromium layer; and
   an iridium layer deposited on the chromium-nitrogen layer opposite to the chromium layer;
   wherein the chromium-nitrogen layer comprises a first chromium-nitrogen layer and a second chromium-nitrogen layer, the first chromium-nitrogen layer abuts the chromium layer, the second chromium-nitrogen layer abuts the iridium layer, the atomic nitrogen content in the first chromium-nitrogen layer increases from a surface of the first chromium-nitrogen layer near the chromium diffusing layer to a opposite surface of the first chromium-nitrogen layer near the second chromium-nitrogen layer, the atomic nitrogen content in the second chromium-nitrogen layer decreases from a surface of the second chromium-nitrogen layer near the first chromium-nitrogen layer to a opposite surface of the second chromium-nitrogen layer near the iridium layer.

10. The coated article as claimed in claim 9, wherein the chromium layer has a thickness of about 0.2 µm to about 0.3 µm.

11. The coated article as claimed in claim 9, wherein the iridium layer has a thickness of about 0.8 µm to about 1 µm.

12. The coated article as claimed in claim 9, wherein the chromium layer, chromium-nitrogen layer and iridium layer are deposited by magnetron sputtering.

13. The coated article as claimed in claim 9, wherein during deposition of the chromium layer on the substrate, the chromium atoms in the chromium layer diffuse toward the substrate to form the chromium diffusing layer between the chromium layer and the substrate.

14. The coated article as claimed in claim 9, wherein the first chromium-nitrogen layer has a thickness of about 0.4 µm to about 0.6 µm, the second chromium-nitrogen layer has a thickness of about 0.4 µm to about 0.6 µm, the chromium-nitrogen layer has a total thickness of about 0.8 µm to about 1.2 µm.

15. The coated article as claimed in claim 9, wherein the chromium-nitrogen layer comprises nitrogen solid solution, chromium metal phase, chromium-nitrogen phase, and iridium atoms.

* * * * *